United States Patent
Bylsma

(10) Patent No.: US 6,441,940 B1
(45) Date of Patent: Aug. 27, 2002

(54) WAVELENGTH STABILIZATION OF LIGHT EMITTING COMPONENTS

(75) Inventor: Richard Bendicks Bylsma, Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/169,726

(22) Filed: Oct. 9, 1998

(51) Int. Cl.⁷ ............................................. H04B 10/02
(52) U.S. Cl. ..................................................... 359/187
(58) Field of Search ................................ 359/187, 249, 359/183, 128, 193

(56) References Cited

U.S. PATENT DOCUMENTS

| | | | | |
|---|---|---|---|---|
| 3,696,344 A | * | 10/1972 | Feinleib ....................... 340/173 |
| 4,306,142 A | * | 12/1981 | Watanabe et al. ........... 250/201 |
| 5,073,331 A | * | 12/1991 | Shirasaki et al. ............. 327/26 |
| 5,325,225 A | * | 6/1994 | Suzaki et al. ............... 359/187 |
| 5,343,324 A | * | 8/1994 | Le et al. ...................... 359/184 |
| 5,440,113 A | * | 8/1995 | Morin et al. ................. 250/205 |
| 5,488,503 A | * | 1/1996 | Schaffner et al. ........... 359/245 |
| 5,523,874 A | * | 6/1996 | Epworth ....................... 359/161 |
| 5,726,794 A | * | 3/1998 | Tajima ......................... 359/249 |
| 5,812,297 A | * | 9/1998 | Mussino et al. ............. 359/181 |
| 5,900,959 A | * | 5/1999 | Noda et al. .................. 359/180 |
| 6,018,582 A | * | 1/2000 | Francois et al. .............. 380/48 |
| 6,120,190 A | * | 9/2000 | Leard et al. ................... 385/88 |
| 6,204,945 B1 | * | 3/2001 | Iwata et al. .................. 359/124 |
| 6,215,572 B1 | * | 4/2001 | Taneda ........................ 359/177 |

OTHER PUBLICATIONS

Harry Newton, Newton's Telecom Dictionary, Nov. 1994, Flatiron Publishing, Inc. p. 792.*

* cited by examiner

*Primary Examiner*—Leslie Pascal

(57) ABSTRACT

The invention is a method and apparatus for controlling the wavelength of a first optical component such as a laser. The light from the laser is coupled to a second optical component, such as a modulator, which produces an output which is function of the wavelength of the light and also a function of voltage applied to the second component. The light from the second component is converted to an electrical signal, and the derivative of the amplitude of the signal with respect to voltage is determined. The derivative is used as a basis for an error signal which controls the wavelength of the first component.

16 Claims, 1 Drawing Sheet

WAVELENGTH STABILIZATION OF LIGHT EMITTING COMPONENTS

FIELD OF THE INVENTION

This invention relates to optoelectronics, and in particular to apparatus for control of the wavelength of emission from optical components.

BACKGROUND OF THE INVENTION

In many optical systems, such as Wavelength Division Multiplexing (WDM) systems, tight control of the wavelength emission of components such as lasers is desired. A typical approach to stabilization is to collect light either from the front or back face of the laser, send it through a component whose transmission is a function of wavelength, and then compare the resulting beam to a reference beam. The ratio of the intensity of the two beams is kept constant by circuitry which controls the temperature of the laser or the electrical bias supplied to the laser.

While such solutions are generally acceptable, it is desired in some systems to eliminate the need for a reference beam.

SUMMARY OF THE INVENTION

The invention in one aspect is an optical apparatus including a first optical component emitting light at a desired wavelength and a second optical component optically coupled to the first optical component, the second component adapted to produce an optical output which is a function of the wavelength of the first component and of a voltage applied to the second component. A source of periodic voltage is electrically coupled to the second component. A photodetector is optically coupled to the second component so as to produce an electrical signal whose amplitude is a function of the voltage applied to the second component. A differentiation circuit is electrically coupled to the photodetector, the output of the differentiation circuit providing an error signal in the event that the light from the optical component differs from the desired wavelength.

The invention in another aspect is a method of controlling the wavelength of light emitted from a first optical component by directing the light through a second optical component which produces an output which is a function of the wavelength of the first optical component and of a voltage applied to the second component. A periodic voltage is applied to the second component, and the output is converted to an electrical signal whose amplitude is a function of the voltage applied to the second component. The derivative of the amplitude with respect to the voltage applied to the second component is determined and this derivative is used as an error signal to correct for any change in wavelength of light from a desired value.

BRIEF DESCRIPTION OF THE FIGURES

These and other features of the invention are delineated in detail in the following drawing.

It will be appreciated that, for purposes of illustration, these figures are not necessarily drawn to scale.

DETAILED DESCRIPTION

Figure 1:
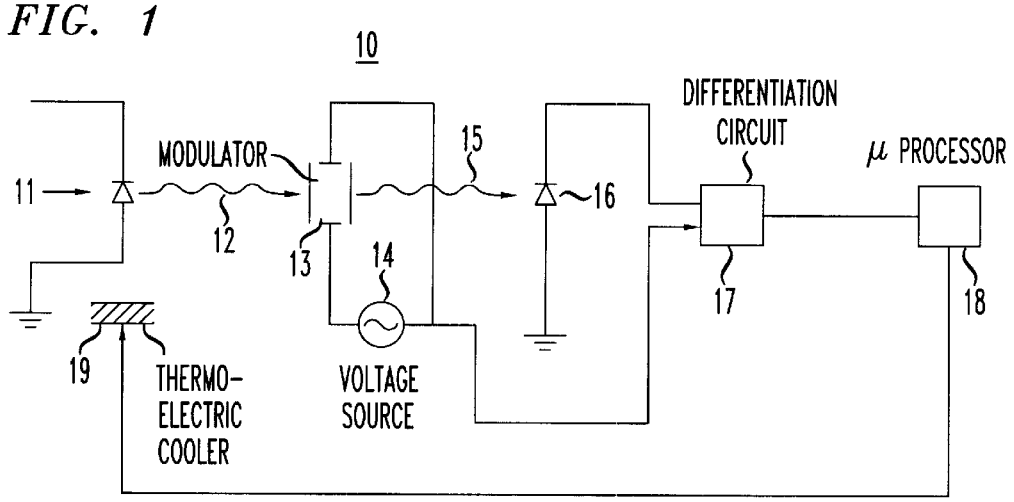
FIG. 1 is a schematic illustration of an apparatus for wavelength stabilization in accordance with one embodiment of the invention.

FIG. 1 illustrates a typical apparatus, 10, incorporating the invention in accordance with one embodiment. The apparatus includes a semiconductor laser, 11, which emits light at a desired wavelength. For example, the laser could be a standard Distributed Feedback (DFB) laser with a main mode at a desired wavelength of 1550 nm. However, many factors, such as ambient temperature changes, laser temperature changes, and laser bias current changes over time can cause the laser wavelength to drift. Consequently, the remaining portion of the apparatus is employed to keep the wavelength at its desired value.

Figure 2:
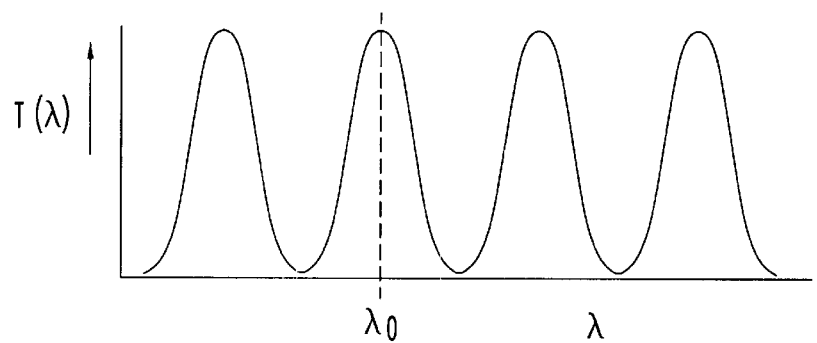
FIG. 2 is an illustration of optical transmission as a function of wavelength for one of the components of the apparatus of FIG. 1.
Figure 3:
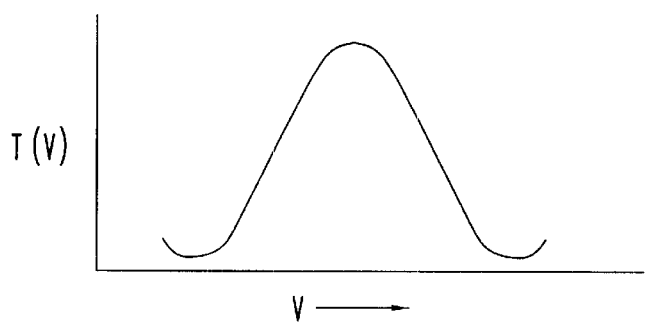
FIG. 3 is an illustration of optical transmission as a function of voltage for the same component.

The light emitted from the laser, represented by arrow 12, is coupled to a modulator, 13, which in this example is a Fabry-Perot modulator. It should be appreciated that, although the laser and modulator are shown as separate components, they could be incorporated in a single device or module. The modulator is driven by a source of periodic voltage, 14, which typically provides a sinusoidal voltage. The application of the periodic voltage to the modulator results in a modulation of the intensity of the laser light so that the light output from the modulator, 13, represented by arrow, 15, has a transmission characteristic of the type illustrated by FIG. 2. It will be noted that the intensity of the output light, 15, is a function of wavelength, $\lambda$, with the modulator tuned to adjust optical path length either by changing the dc voltage or by rotating the modulator so that the desired wavelength, $\lambda_o$, coincides with a maximum (or minimum) on the transmission curve. The intensity of the light output, 15, as a function of the applied voltage to the modulator is illustrated in FIG. 3.

Figure 4:
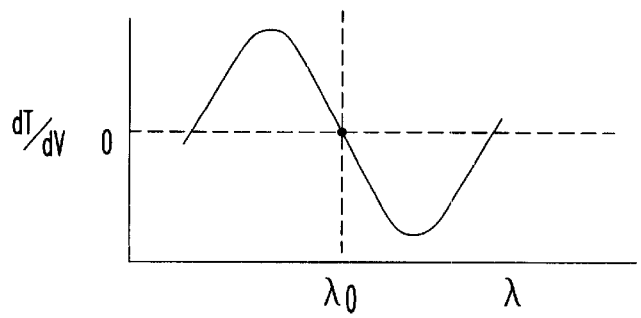
FIG. 4 is an illustration of the derivative of the optical transmission with respect to voltage which is an output of another component of the apparatus of FIG. 1.

The light output, 15, is optically coupled to a standard photodetector, such as a pin photodiode, where the optical signal is converted to an electrical signal. The signal component of interest from the photodetector, 16, is normally the signal having the same frequency as the periodic voltage signal, and this signal is electrically coupled to a differentiation circuit, 17, whose output signal will be the derivative of the intensity of the beam, 15, as a function of the voltage applied to the modulator, 13. This derivative (dT/dV) as a function of wavelength, $\lambda$, of beam 15 is illustrated in FIG. 4. It will be appreciated that the derivative will be zero at the maximum (or minimum) of the curve of FIG. 3, and this maximum (or minimum) corresponds to the desired wavelength, $\lambda_o$.

Thus, as long as the laser emits light at the desired wavelength, $\lambda_o$, the output from the differentiation circuit will be zero. If, however, the wavelength should drift, the output of differentiation circuit, 17, will be an error signal proportional to the amount of the drift. This signal is coupled to a microprocessor, 18, which does the appropriate calculations to determine how much the wavelength, $\lambda$, of beam 15 has deviated from the desired wavelength, $\lambda_o$. The output from the microprocessor, 18, is coupled to some apparatus which will alter the wavelength of the laser, 11, in response to the signal from the microprocessor. In this example, the apparatus is a thermoelectric cooler, 19, which will alter the temperature of the laser, 11, and therefore change its wavelength. Alternatively, the apparatus could be a drive circuit (not shown) where a bias supplied to the laser will change in response to the signal from the microprocessor. In either event, the laser wavelength will be brought back to its desired value as a result of the error signal generated by the differentiation circuit, 17, without the need for comparing the laser light with a reference beam.

While the invention has been described with reference to a particular embodiment, it will be appreciated that several modifications may be employed. For example, the light which is monitored can be light from the backface of the laser. Further, while a Fabry-Perot modulator has been described, the invention may employ any component where the light output is a function of wavelength of the input and applied voltage.

What is claimed is:

1. An optical apparatus comprising:
   a first optical component adapted for emitting light at a desired wavelength;
   a modulator optically coupled to the first component, the modulator adapted for producing an optical output which is a function of the wavelength of the first component and of a voltage applied to the modulator;
   a photodetector optically coupled to the modulator so as to produce an electrical signal whose amplitude is a function of the voltage applied to the modulator; and
   a differentiation circuit electrically coupled to the photodetector, the output of the differentiation circuit providing an error signal in the event that the wavelength from the first component differs from a desired value, wherein the differentiation circuit is adapted to produce the derivative of the amplitude with respect to the voltage applied to the modulator.

2. The apparatus according to claim 1 wherein the photodetector is a pin photodiode.

3. The apparatus according to claim 1 wherein the modulator is tuned so that the desired wavelength coincides with a maximum or minimum of the output of the second component, and the error signal is produced when the derivative is not zero.

4. The apparatus according to claim 1 further comprising a microprocessor electrically coupled to the differentiation circuit.

5. The apparatus according to claim 1 wherein the modulator is a Fabry-Perot modulator.

6. The apparatus according to claim 1 wherein the first optical component is a laser.

7. The apparatus according to claim 1 wherein the voltage applied to the modulator is sinusoidal.

8. The apparatus according to claim 1 wherein the error signal is coupled to a thermoelectric cooler.

9. A method for controlling a wavelength of light emitted from a first optical component comprising the steps of:
   directing the light through a modulator which produces an output which is a function of the wavelength of the first optical component and of a voltage applied to the modulator;
   converting the output to an electrical signal whose amplitude is a function of the voltage applied to the modulator;
   determining the derivative of the amplitude with respect to the voltage applied to the modulator and producing therefrom an error signal to correct for any change in wavelength of light from a desired value.

10. The method according to claim 9 wherein the output is converted to an electrical signal by a pin photodiode.

11. The method according to claim 9 wherein the modulator is tuned so that the desired wavelength coincides with a maximum or minimum of the output of the modulator, and the error signal is produced when the derivative is not zero.

12. The method according to claim 9 wherein derivative signal is coupled to a microprocessor.

13. The method according to claim 9 wherein the modulator is a Fabry-Perot modulator.

14. The method according to claim 9 wherein the first optical component is a laser.

15. The method according to claim 9 wherein the voltage applied to the modulator is sinusoidal.

16. The method according to claim 9 wherein the error signal is coupled to a thermoelectric cooler.

* * * * *